(12) United States Patent
Fleming et al.

(10) Patent No.: US 6,290,822 B1
(45) Date of Patent: *Sep. 18, 2001

(54) SPUTTERING METHOD FOR FORMING DIELECTRIC FILMS

(75) Inventors: Robert McIenore Fleming, Chatham Township, Morris County; Michael Louis Steigerwald, Martinsville; Yiu-Huen Wong, Summit, all of NJ (US); Susan M. Zahurak, Lebanon, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/472,332

(22) Filed: Dec. 23, 1999

Related U.S. Application Data

(60) Provisional application No. 60/117,186, filed on Jan. 26, 1999.

(51) Int. Cl.[7] .................................................... C23C 14/34
(52) U.S. Cl. ................................ 204/192.22; 204/192.15
(58) Field of Search ......................... 204/192.22, 192.13, 204/192.15

(56) References Cited

U.S. PATENT DOCUMENTS

| | | |
|---|---|---|
| 5,319,226 * | 6/1994 | Sohn et al. .......................... 257/253 |
| 5,814,852 | 9/1998 | Sandhu et al. . |
| 5,856,704 | 1/1999 | Schuele . |
| 5,944,964 * | 8/1999 | Solberg et al. ................. 204/192.22 |
| 6,149,778 * | 11/2000 | Jin et al. ......................... 204/192.22 |

FOREIGN PATENT DOCUMENTS 61 035 548 * 2/1986 (JP) .

OTHER PUBLICATIONS

J. P. Chang, M. L. Steigerwald, R. M. Fleming, R. L. Opila and G. B. Alers; "Thermal Stability of Ta2O5 in Metal–Oxide–Metal Capacitor Structures"; Apppplied Physics Letters, vol. 74, No. 24; Jun. 14, 1999; pp. 3705–3707.

* cited by examiner

*Primary Examiner*—Nam Nguyen
*Assistant Examiner*—Gregg Cantelmo

(57) ABSTRACT

A method for forming a dielectric film having a desired composition comprising sputtering a dielectric material onto a substrate to produce an intermediary film, the intermediary film incorporating one or more elements in addition to those elements included in the desired composition of the dielectric film; and removing the one or more additional elements from the intermediary film to produce the dielectric film having the desired composition.

17 Claims, 1 Drawing Sheet

SPUTTERING METHOD FOR FORMING DIELECTRIC FILMS

This application claims priority to U.S. provisional application No. 60/117,186 filed Jan. 26, 1999.

BACKGROUND OF THE INVENTION

1. Field of the Invention

The present invention relates to dielectric films, and more particularly, to improved methods for forming such materials.

2. Description of the Related Art

Dielectric films and, more particularly, high dielectric constant ($\epsilon>10$) films, such as tantalum pentoxide ($Ta_2O_5$), titanium oxide ($TiO_2$), and barium strontium titanate ($(Ba, Sr)TiO_3$ or BST), play an important role in the manufacturing of integrated circuits. Such films have applicability, for example, in the manufacture of metal-oxide-semiconductor (MOS) transistors as well as in the manufacture of metal-oxide-metal (MOM) and metal-insulator-metal (MIM) capacitors and amorphous semiconductors.

High dielectric constant films are generally formed by either sputtering or chemical vapor deposition (CVD). For several reasons, the preferred method, however, is CVD. For example, high dielectric constant films deposited using CVD are far less dense and, therefore, can be annealed at lower temperatures than sputtered films. Further, sputtered high dielectric constant films are typically oxygen deficient (or metal-rich). This is especially true in the interfacial regions between the electrode and the dielectric, as in the case of MOM and MIM capacitors. The oxygen deficiency that is typical of a sputtered high dielectric constant film generates pathways for electrical conduction (referred to as "leakage"). This leakage (and hence the oxygen deficiency that causes it) is considered a flaw in the film. In an attempt to remedy this flaw, post deposition annealing of the film in an oxygen ambient is usually required to incorporate oxygen into the film and thereby reduce the leakage by eliminating (or substantially eliminating) the oxygen deficiency. However, because of the dense nature of sputtered films, they are difficult to anneal.

Despite the foregoing disadvantages of sputtering, sputtering does have some advantages over CVD for forming high dielectric constant films. For example, with sputtering, there is more flexibility in varying the composition of dopants in the resultant film. Further, it is easier to change materials to be deposited by sputtering. Still further, sputtering involves fewer dangerous chemicals than CVD.

SUMMARY OF THE INVENTION

Accordingly, the present invention is directed to a method for forming dielectric films, and in particular, high dielectric constant films that substantially obviates one or more of the problems due to limitations and disadvantages of the related art.

Additional features and advantages of the invention will be set forth in the description that follows and, in part, will be apparent from the description, or may be learned by practice of the invention. The objectives and other advantages of the invention will be realized and attained by the method particularly pointed out in the written description and claims hereof as well as the appended drawing.

To achieve these and other advantages and in accordance with the purposes of the invention, as embodied and broadly described, the invention provides a method for forming a dielectric film having a desired composition comprising sputtering a dielectric material onto a substrate to produce an intermediary film, the intermediary film incorporating one or more elements in addition to those elements included in the desired composition of the dielectric film; and removing the one or more additional elements from the intermediary film to produce the dielectric film having the desired composition.

In one aspect of the invention, the dielectric film is a high dielectric constant film.

In another aspect of the invention, the additional one or more elements are introduced with an ambient gas during the sputtering of the dielectric material.

In yet another aspect of the invention, the sputtering of the dielectric material includes as least one of reactive sputtering, chemical sputtering, and RF sputtering of the dielectric material.

In still another aspect of the invention, the removing of the one or more additional elements from the intermediary film includes annealing the intermediary film in an oxidizing ambient comprising $O_2$ or $NO_2$ and/or performing a plasma treatment on the intermediary film.

In still yet another aspect of the invention, the dielectric material comprises $Ta_2O_5$, $TiO_2$, or $ZrO_2$.

It is to be understood that both the foregoing general description and the following detailed description are exemplary and explanatory and are intended to provide further explanation of the invention as claimed.

BRIEF DESCRIPTION OF THE DRAWING

The accompanying drawing, which is included to provide a further understanding of the invention and is incorporated in and constitutes a part of this specification, illustrates several embodiments of the invention and, together with the written description, serves to explain the principles of the invention. In the drawing.

DESCRIPTION OF THE PREFERRED EMBODIMENTS

Figure 1:
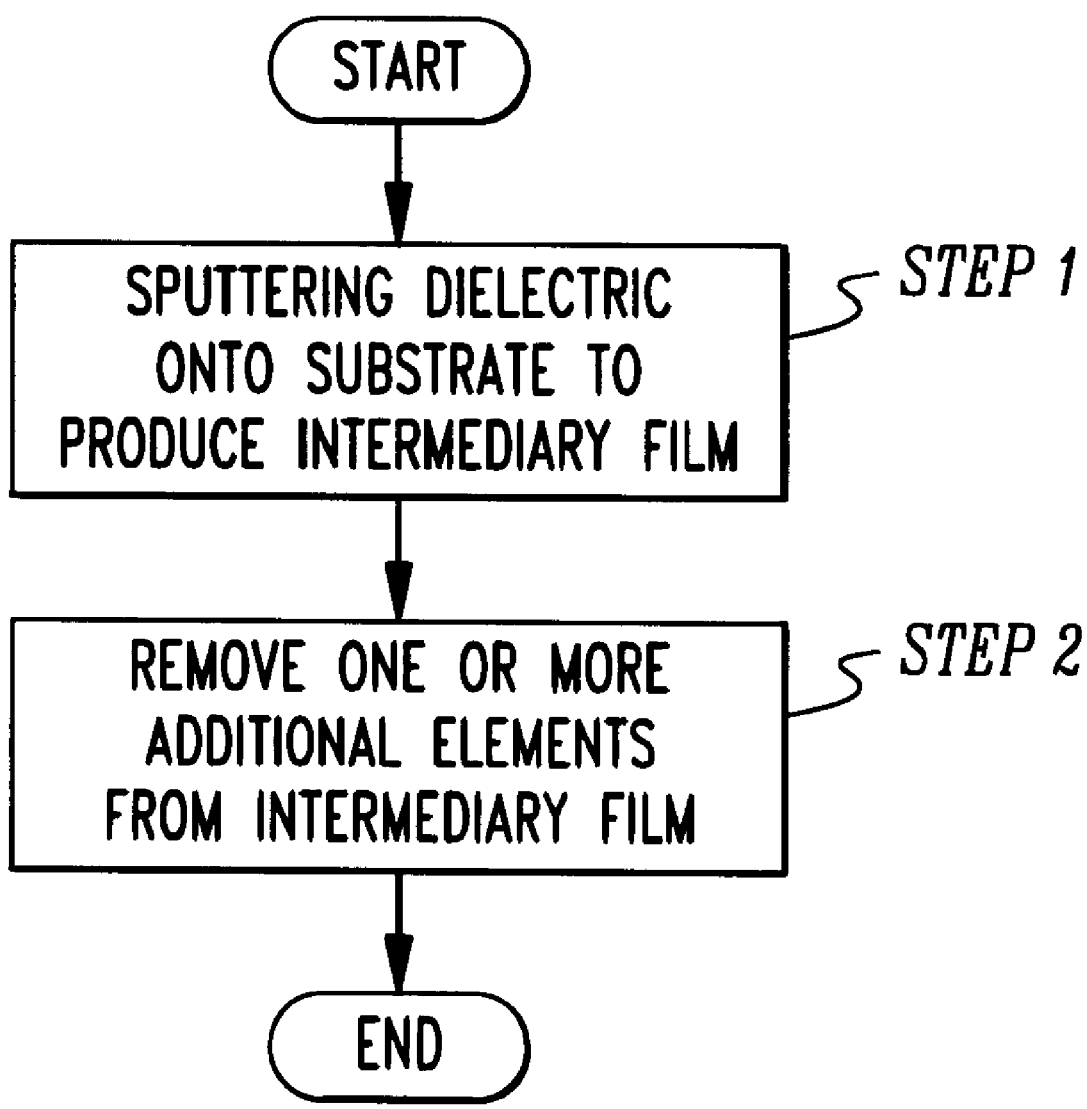
FIG. 1 is a flow diagram of a method for depositing dielectric films according to the present invention.

Reference will now be made in detail to the presently preferred embodiments of the invention, an example of which is illustrated in the accompanying drawing.

Referring to FIG. 1, the method for forming a dielectric film having a desired composition according to the present invention comprises sputtering a dielectric material onto a substrate to produce an intermediary film that incorporates one or more elements in addition to those elements included in the desired composition of the dielectric film (Step 1). The method further comprises subsequently removing the one or more additional elements from the intermediary film by a post deposition treatment to produce the dielectric film having the desired composition (Step 2).

The additional one or more elements are preferably introduced with the ambient gas in an otherwise conventional sputtering process (e.g., reactive sputtering, chemical sputtering, and/or RF sputtering) using a conventional sputtering apparatus. The selection of the one or more elements introduced with the ambient gas and the ratio of those elements to the ambient gas can be made in accordance with the desired composition of the dielectric film, as is known to those skilled in the art.

The introduction of the additional one or more elements during sputtering results in the intermediary film being more porous (i.e., less dense) than had the one or more additional elements not been introduced. Because the intermediary film is more porous, it is easier to allow in-diffusion or out-diffusion of species through the film. For example, as discussed below, the increased porosity facilities the incorporation of oxygen into the intermediary film during a subsequent annealing of the film in an oxidizing ambient. Furthermore, the increased porosity of the intermediary film makes it is easier to remove contaminants (adventitious or intended) from film.

The post deposition treatment preferably comprises annealing the intermediary film (e.g., RF or microwave annealing). However, the post deposition treatment can comprise any other treatment know to those skilled in the art for removing the additional one or more elements from the intermediary film, such as a plasma treatment or a combination of annealing and plasma treatment. Again, the specific post deposition treatment used and the parameters for that treatment can be determined in accordance with the desired composition of the dielectric film, as is known to those skilled in the art. In the case of annealing the intermediary film in an oxidizing ambient, not only are the additional one or more elements removed from the intermediary film, but oxygen is also incorporated into the film. As discussed above, the incorporation of oxygen into the intermediary film in this manner reduces the leakage of the final dielectric film.

EXAMPLE 1

In one example of the present invention, an intermediary film was formed on each of a silicon, oxidized silicon, and metal coated silicon substrate by sputtering $Ta_2O_5$ in an ambient gas comprising Ar and X, where X was $CO_2$, $N_2$, and/or $CH_4$ and the ratio of Ar to X was 1:1. The sputtering occurred under the following conditions: substrate temperature of approximately 23° C.–350° C.; pressure of approximately 5–20 mtorr; plasma power of approximately 200 watts; and ambient gas flow rate of approximately 50 sccm per minute. The growth rate of the intermediary film under these conditions was approximately 20 Å/min.

The sputtering process resulted in the intermediary film comprising $Ta_2O_5$ incorporated with carbon, nitrogen, and/or hydrogen, depending on the composition of the ambient gas. The intermediary film was then subjected to microwave annealing in an oxidizing ambient, such as $O_2$ or $NO_2$, to remove the carbon, nitrogen, and/or hydrogen and to incorporate oxygen into the film.

EXAMPLE 2

In another example of the present invention, an intermediary film was formed on each of a silicon, oxidized silicon, and metal coated silicon substrate by sputtering $TiO_2$ in an ambient gas comprising Ar and X, where X was $CO_2$, $N_2$, and/or $CH_4$ and the ratio of Ar to X was 1:1. The sputtering occurred under the following conditions: substrate temperature of approximately 23° C.–350° C.; pressure of approximately 5–20 mtorr; plasma power of approximately 200 watts; and ambient gas flow rate of approximately 50 sccm per minute. The growth rate of the intermediary film under these conditions was approximately 20 Å/min.

The sputtering process resulted in the intermediary film comprising $TiO_2$ incorporated with carbon, nitrogen, and/or hydrogen, depending on the composition of the ambient gas. The intermediary film was then subjected to microwave annealing in an oxidizing ambient, such as $O_2$ or $NO_2$, to remove the carbon, nitrogen, and/or hydrogen and to incorporate oxygen into the film.

EXAMPLE 3

In yet another example of the present invention, a $ZrO_2$ film was formed on each of a silicon, oxidized silicon, and metal coated silicon substrate by sputtering $ZrO_2$ in an ambient gas comprising Ar and X, where X was $CO_2$, $N_2$, and/or $CH_4$ and the ratio of Ar to X was 1:1. The sputtering occurred under the following conditions: substrate temperature of approximately 23° C.–350° C.; pressure of approximately 5–20 mtorr; plasma power of approximately 200 watts; and ambient gas flow rate of approximately 50 sccm per minute. The growth rate of the intermediary film under these conditions was approximately 20 Å/min.

The sputtering process resulted in the intermediary film comprising $ZrO_2$ incorporated with carbon, nitrogen, and/or hydrogen, depending on the composition of the ambient gas. The intermediary film was then subjected to microwave annealing in an oxidizing ambient, such as $O_2$ or $NO_2$, to remove the carbon, nitrogen, and/or hydrogen and to incorporate oxygen into the film.

It will be apparent to those skilled in the art that various modifications and variations can be made to method of the present invention without departing from the spirit or scope of the invention. Thus, it is intended that the present invention covers the modifications and variations of this invention provided they come within the scope of the appended claims and their equivalents.

What is claimed is:

1. A method of forming a dielectric film having a desired composition comprising:

sputtering a high dielectric constant film onto a substrate to incorporate at least carbon into the high dielectric constant film in addition to those elements included in the desired composition of the high dielectric constant film wherein an ambient gas comprises Ar and $CO_2$ and the ratio of Ar to $CO_2$ is 1:1; and removing at least the carbon from the film.

2. The method of claim 1, wherein the dielectric film is a high dielectric constant film.

3. The method of claim 1, wherein the additional one or more elements are introduced with an ambient gas during the sputtering of the dielectric material.

4. The method of claim 1, wherein the sputtering of the dielectric material includes at least one of reactive sputtering, chemical sputtering, and RF sputtering.

5. The method of claim 1, wherein the removing of the one or more additional elements from the intermediary film includes annealing the intermediary film.

6. The method of claim 5, wherein the annealing of the intermediary film is performed in an oxidizing ambient.

7. The method of claim 6, wherein the oxidizing ambient comprises $O_2$ or $NO_2$.

8. The method of claim 1, wherein the removing of the one or more additional elements from the intermediary film includes performing a plasma treatment on the intermediary film.

9. The method of claim 8, wherein the removing of the one or more additional elements from the intermediary film further includes annealing the intermediary film.

10. The method of claim 1, wherein the dielectric material comprises $Ta_2O_5$, $TiO_2$, or $ZrO_2$.

11. The method of claim 10, wherein the additional one or more elements are introduced with said ambient gas during the sputtering of the dielectric material.

12. The method of claim 1, wherein the sputtering of the dielectric material occurs under the following conditions: substrate temperature of approximately 23–350° C.; pressure of approximately 5–20 mtorr; plasma power of approximately 200 watts; and ambient gas flow rate of approximately 50 sccm per minute.

13. The method of claim 13, wherein the growth rate of the intermediary film is approximately 20 Å/min.

14. The method of claim 13, wherein the removing of the one or more additional elements from the intermediary film includes microwave annealing the intermediary film in an oxidizing ambient.

15. The method of claim 14, wherein the oxidizing ambient comprises $O_2$ or $NO_2$.

16. A method of forming a dielectric film having a desired composition comprising:

sputtering a high dielectric constant film onto a substrate to incorporate at least carbon into the high dielectric constant film in addition to those elements included in the desired composition of the high dielectric constant film wherein an ambient gas comprises Ar and $CO_2$ and the ratio of Ar to $CO_2$ is 1:1; and annealing the film in an oxygen atmosphere.

17. The method of claim 16, wherein annealing includes removing at least the carbon from the film.

* * * * *